United States Patent
Wu (10) Patent No.: US 11,038,006 B1
(45) Date of Patent: Jun. 15, 2021

(54) DISPLAY PANEL AND BONDING METHOD OF THE SAME (71) Applicant: WUHAN CHINA STAR OPTOELECTRONICS SEMICONDUCTOR DISPLAY TECHNOLOGY CO., LTD., Wuhan (CN)

(72) Inventor: Jianjun Wu, Wuhan (CN)

( * ) Notice: Subject to any disclaimer, the term of this patent is extended or adjusted under 35 U.S.C. 154(b) by 321 days.

(21) Appl. No.: 16/339,367

(22) PCT Filed: Sep. 14, 2018

(86) PCT No.: PCT/CN2018/105632
§ 371 (c)(1),
(2) Date: Apr. 4, 2019

(87) PCT Pub. No.: WO2020/034293
PCT Pub. Date: Feb. 20, 2020

(30) Foreign Application Priority Data

Aug. 14, 2018 (CN) .......................... 201810922774.8

(51) Int. Cl.
*H01L 27/32* (2006.01)
*H01L 23/00* (2006.01)
(Continued)

(52) U.S. Cl.
CPC .......... *H01L 27/3276* (2013.01); *H01L 24/29* (2013.01); *H01L 24/32* (2013.01);
(Continued)

(58) Field of Classification Search
CPC ..... H01L 27/3276; H01L 24/29; H01L 24/32; H01L 24/83; H01L 51/5253; H01L 51/5221; H01L 27/124; H01L 27/3262; H01K 1/189; G09G 3/006; H05K 1/144; H05K 1/092; H05K 1/0298; H05K 1/117; H05K 1/118; H05K 3/323; H05K 3/363; H05K 3/368
(Continued)

(56) References Cited

U.S. PATENT DOCUMENTS 6,104,464 A * 8/2000 Adachi ............... G02F 1/13452
257/E23.177
6,133,978 A * 10/2000 Tajima ................ G02F 1/13452
349/150
(Continued)

FOREIGN PATENT DOCUMENTS

CN     101800238 A     8/2010
CN     104253149 A     12/2014
(Continued)

*Primary Examiner* — Mouloucoulaye Inoussa (57) ABSTRACT

The present disclosure provides a display panel and a bonding method of the display panel. Signal lines of a display area of the display panel extend to a bonding area of the non-display area. A conductive adhesive layer is formed in the bonding area. A waterproof adhesive layer is formed in the non-display area of the bonding area near the display area. The conductive adhesive layer includes a conductive-particles doped region and a first insulating rubber material region formed in the conductive-particles doped region near the display area.

14 Claims, 4 Drawing Sheets

(51) Int. Cl.
*H05K 1/18* (2006.01)
*H01L 51/52* (2006.01)
(52) U.S. Cl.
CPC .......... *H01L 24/83* (2013.01); *H01L 51/5253* (2013.01); *H05K 1/189* (2013.01); *H01L 2224/29078* (2013.01); *H01L 2224/29499* (2013.01); *H01L 2224/32225* (2013.01); *H01L 2224/83191* (2013.01); *H01L 2224/83203* (2013.01); *H05K 2201/10128* (2013.01)
(58) Field of Classification Search
USPC ................ 361/750, 749, 783; 257/E21.503, 257/E21.514, E23.055, E23.065; 438/106, 118, 119, 28
See application file for complete search history.

(56) References Cited

U.S. PATENT DOCUMENTS

| | | | | |
|---|---|---|---|---|
| 6,340,607 | B1* | 1/2002 | Yamada | H01L 21/563 257/E21.503 |
| 9,087,703 | B1 | 7/2015 | Chen et al. | |
| 2009/0141438 | A1* | 6/2009 | Aita | G02F 1/13452 361/679.21 |
| 2009/0231823 | A1* | 9/2009 | Kunimatsu | H05K 1/111 361/783 |
| 2010/0220072 | A1* | 9/2010 | Chien | G06F 3/041 345/173 |
| 2011/0267320 | A1* | 11/2011 | Hu | G02F 1/13452 345/204 |
| 2012/0092017 | A1 | 4/2012 | Qiu | |
| 2013/0264103 | A1* | 10/2013 | Ye | H05K 1/0277 174/254 |
| 2014/0131889 | A1* | 5/2014 | Kim | H01L 23/552 257/774 |
| 2014/0192491 | A1* | 7/2014 | Chiang | H05K 3/28 361/750 |
| 2016/0062520 | A1* | 3/2016 | Choi | G06F 3/0446 345/174 |
| 2017/0064829 | A1* | 3/2017 | Ohtsu | H01R 12/62 |
| 2018/0205037 | A1 | 7/2018 | Kim et al. | |
| 2018/0231821 | A1* | 8/2018 | Kawai | H05K 1/185 |

FOREIGN PATENT DOCUMENTS

| | | |
|---|---|---|
| CN | 204045594 U | 12/2014 |
| CN | 104393015 A | 3/2015 |
| CN | 105320317 A | 2/2016 |
| CN | 106409869 A | 2/2017 |

\* cited by examiner

DISPLAY PANEL AND BONDING METHOD OF THE SAME

CROSS REFERENCE TO RELATED APPLICATION

This application claims the priority of International Application No. PCT/CN2018/105632 filed on 2018 Sep. 14, which claims priority to Chinese Application No. 201810922774.8, filed on 2018 Aug. 14. The entire disclosures of each of the above applications are incorporated herein by reference.

BACKGROUND OF THE INVENTION

Field of Invention

The present invention relates to the field of display panel manufacturing technology, and particularly to a display panel and a bonding method of the display panel.

Description of Prior Art

The mobile phone using environment is diversified, and some high-humidity and high-temperature environments are more corrosive to the screen of the mobile phone, so the requirement for corrosion resistance of the screen is increasingly higher. The main concern for waterproof and anti-corrosion of the module segment lies in the lines of the wire on array (WOA) of the bonding area between the chip on film (COF) and the display panel. The anti-corrosion method for the WOA lines according to the traditional LCD fabrication process is to apply anti-corrosion coating on the front side of the WOA lines and the back side of the bonding area of the COF and the WOA.

Figure 1A:
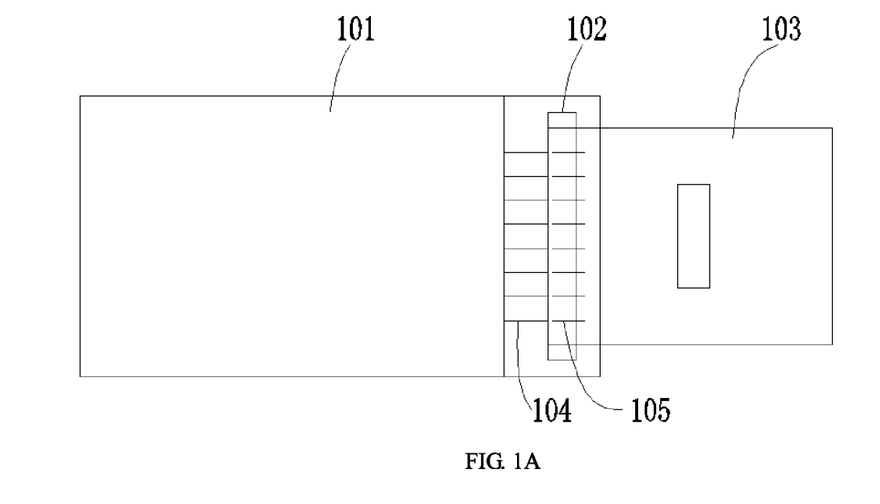
FIGS. 1A-1B are schematic views of a structure of the display panel in prior art.
Figure 1B:
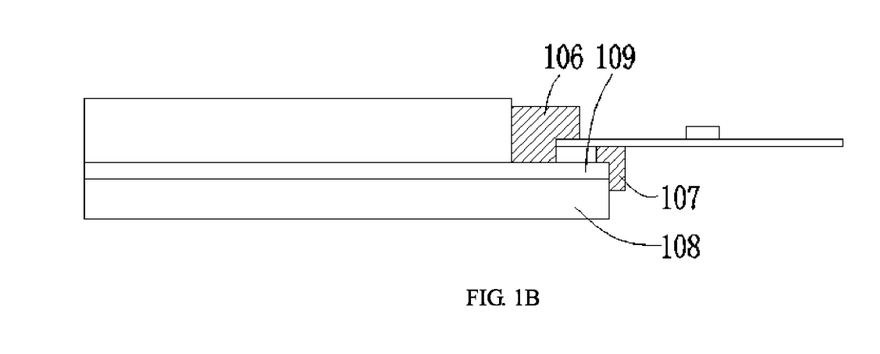

Referring to FIGS. 1A-1B, after the WOA lines 104 connected to the internal signal line of the display panel 101 formed in the non-display area of the display panel 101 and the flexible circuit board 103 are bonded together by the conductive adhesive 102, an exposed portion of the WOA lines 104 corresponding to outside of the conductive adhesive 102 and an exposed portion of the COF lines 105 of the flexible circuit board 103 for bonding corresponding to outside of the conductive adhesive 102 are highly susceptible to be corroded. The existing countermeasure is to apply a layer of waterproof glue in the corrosive area to isolate air and moisture and achieve anti-corrosion requirements. As shown in FIG. 1B, the exposed portion of the WOA lines 104 is covered by the front side waterproof adhesive 106, and the exposed portion of the COF lines 105 is covered by the back surface waterproof adhesive 107. In the OLED industry, since the glass substrate 108 needs to be stripped, there are two problems; one is that the back surface waterproof adhesive 107 and the glass substrate 108 are adhered, which is not conducive for the stripping operation; the second is that the height of the back surface waterproof adhesive 107 exceeds the OLED layer 109 after the glass substrate 108 is stripped, which affects the subsequent process, and this problem cannot be effectively solved by the current industry. The present solution is to have the back side not coated with the waterproof glue 107. Such a solution has a risk for the quality in the long-term.

Therefore, it is necessary to provide a display panel and a bonding method of the display panel to solve the problems existing in the prior art.

SUMMARY OF THE INVENTION

The application mainly provides a display panel and a bonding method of the display panel to avoid signal lines to be corroded without forming a back surface waterproof adhesive and improve product quality and stability.

For the above-mentioned objective, the present disclosure employs the following technical schemes.

The present disclosure provides a display panel, the display panel includes a display area and a non-display area formed at a side of the display area, at least two signal lines are arranged in the non-display area, a bonding area is defined in the non-display area, ends of one side of the signal lines extend to the bonding area;

an overlapping area and a non-overlapping area are defined in the non-display area and the bonding area, a first area is defined in the non-overlapping area formed at a side of the bonding area, a second area is defined in the non-overlapping area formed at another, opposite side of the bonding area; and a waterproof adhesive layer is formed in the first region, a conductive adhesive layer is formed in the bonding area; the conductive adhesive layer includes a conductive-particles doped region and a first insulating rubber material region formed at one side of the conductive-particles doped region, the first insulating rubber material region is formed between the conductive-particles doped region and the second area.

In the display panel of the present disclosure, a second insulating rubber material region is formed at another, opposite side of the conductive-particles doped region, the second insulating rubber material region extends toward the first area and ends at one side edge of the bonding area, the first insulating rubber region extends toward the second area and ends at another, opposite side edge of the bonding area.

In the display panel of the present disclosure, the waterproof adhesive layer and the conductive adhesive layer are formed on the signal lines.

In the display panel of the present disclosure, a flexible circuit board is connected with the display panel, a plurality of connection terminals is formed on the flexible circuit board, and the connection terminals are correspondingly located in the bonding area.

In the display panel of the present disclosure, the waterproof rubber layer extends at least to one side surface of the flexible circuit board.

The present disclosure provides a bonding method of a display panel, the bonding method includes:

a step S10 of providing a display panel, defining a display area, a non-display area formed at a side of the display area, and a bonding area in the non-display area are defined in the display panel surface; defining an overlapping area and a non-overlapping area in the non-display area and the bonding area, defining a first area in the non-overlapping area formed at a side of the bonding area, defining a second area in the non-overlapping area formed at another, opposite side of the bonding area;

a step S20 of forming a conductive adhesive layer on the bonding area;

a step S30 of adhering ends of a plurality of connection terminals of the flexible circuit board to the conductive adhesive layer, and then bonding the flexible circuit board and the bonding area together by a heat pressing device; and the conductive adhesive layer comprises a conductive-particles doped region and a first insulating rubber material region formed at one side of the conductive-particles doped region, the first insulating rubber material region is formed between the conductive-particles doped region and the second area.

In the bonding method of the display panel of the present disclosure, the conductive adhesive layer further includes a second insulating rubber material region formed at another, opposite side of the conductive-particles doped region, and the second insulating rubber material region extends toward the first area and ends at one side edge of the bonding area.

In the bonding method of the display panel of the present disclosure, the connection terminals formed on the flexible circuit board are correspondingly located in the bonding area.

In the bonding method of the display panel of the present disclosure, the step S30 further including:

a step S40 of forming a waterproof rubber layer in the first region to forming a sealant layer combined by the waterproof rubber layer and the conductive adhesive layer in the non-display region.

The present disclosure provides a display panel, the display panel includes a display area and a non-display area formed at a side of the display area, at least two signal lines are arranged in the non-display area, a bonding area is defined in the non-display area, ends of one side of the signal lines extend to the bonding area;

a plurality of thin film transistors are formed in the display area, ends of another, opposite side of the signal lines are correspondingly connected to the thin film transistors;

an overlapping area and a non-overlapping area are defined in the non-display area and the bonding area, a first area is defined in the non-overlapping area formed at a side of the bonding area, a second area is defined in the non-overlapping area formed at another, opposite side of the bonding area; and a waterproof adhesive layer is formed in the first region, a conductive adhesive layer is formed in the bonding area; the conductive adhesive layer includes a conductive-particles doped region and a first insulating rubber material region formed at one side of the conductive-particles doped region, the first insulating rubber material region is formed between the conductive-particles doped region and the second area.

In the display panel of the present disclosure, a second insulating rubber material region is formed at another, opposite side of the conductive-particles doped region, the second insulating rubber material region extends toward the first area and ends at a side edge of the bonding area, the first insulating rubber region extends toward the second area and ends at another, opposite side edge of the bonding area.

In the display panel of the present disclosure, the waterproof adhesive layer and the conductive adhesive layer are formed on the signal lines.

In the display panel of the present disclosure, a flexible circuit board is connected with the display panel, a plurality of connection terminals is formed on the flexible circuit board, and the connection terminals are correspondingly located in the bonding area.

In the display panel of the present disclosure, the waterproof rubber layer extends at least to one side surface of the flexible circuit board.

The beneficial effect of this invention is: in a display panel and a bonding method of the display panel of the present disclosure, among a COF bonding process, an insulating rubber material layer are is formed at one side or two sides of the conductive-particles doped region of the conductive adhesive layer to increase a width of the conductive adhesive layer, a front waterproof adhesive layer covers signal lines of a display area to form a sealed waterproofing area and to solve a corrosion risk of a back surface of OLED products without the waterproof adhesive layer after a COF bonding process. The present disclosure makes the back surface of OLED products not to be coated by the waterproof adhesive layer and to separate a glass substrate from the flexible OLED products without effecting a continuing process; because the insulating rubber material layers formed at two sides of the conductive-particles doped region have a supporting function to make a same flowability in left and right sides of the conductive-particles doped region in a pressing process to promote a pressing accuracy and to avoid a decreasing accuracy problem caused by a decreasing size of the bonding area. The present disclosure can ensure that the conductive properties of the conductive-particles doped region are not affected, and also ensure that the signal lines of the non-display area are not in contact with the air to avoid the lines to be corroded, and to save the coating process, thereby to improve product quality and stability and to improve a corrosion resistance of the product's extreme use environment.

BRIEF DESCRIPTION OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF THE PREFERRED EMBODIMENTS

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The present disclosure is directed to a display panel of the prior art. Since a waterproof adhesive coated in a back surface of the a flexible circuit board bonding with signal lines of the display panel are adhered to a glass substrate, the peeling is unfavorable, and a height of the back surface waterproof adhesive after the glass substrate peeled off are over the OLED layer to affect of a subsequent process. The present disclosure can solve the above defects.

Figure 2A:
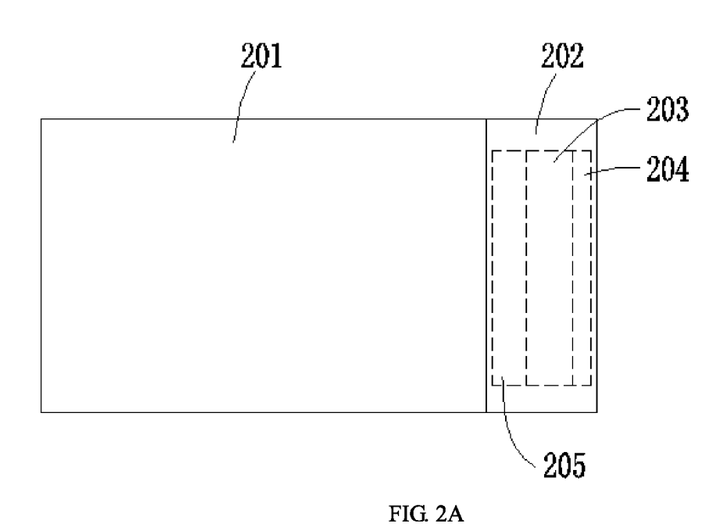
FIG. 2A is a schematic view of a structure of a display panel of one exemplary embodiment according to the present disclosure.
Figure 2B:
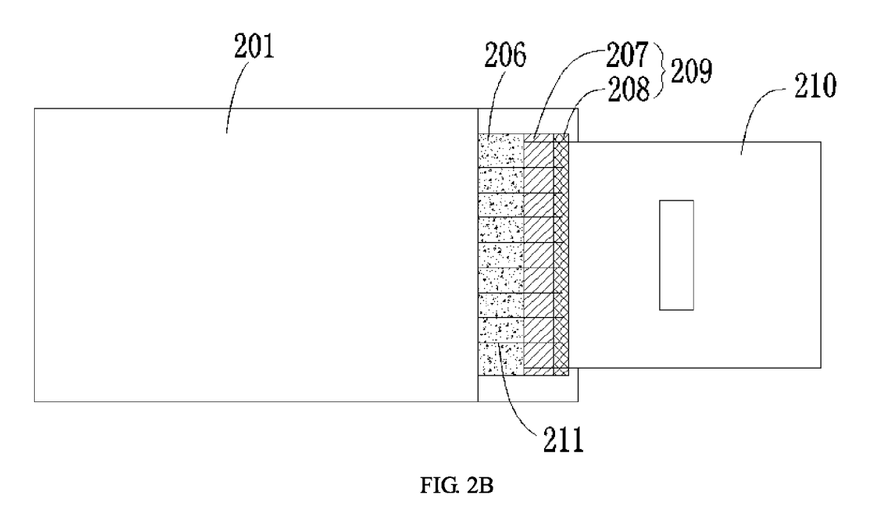
FIG. 2B is a top view of the display panel of the exemplary embodiment according to the present disclosure.
Figure 2C:
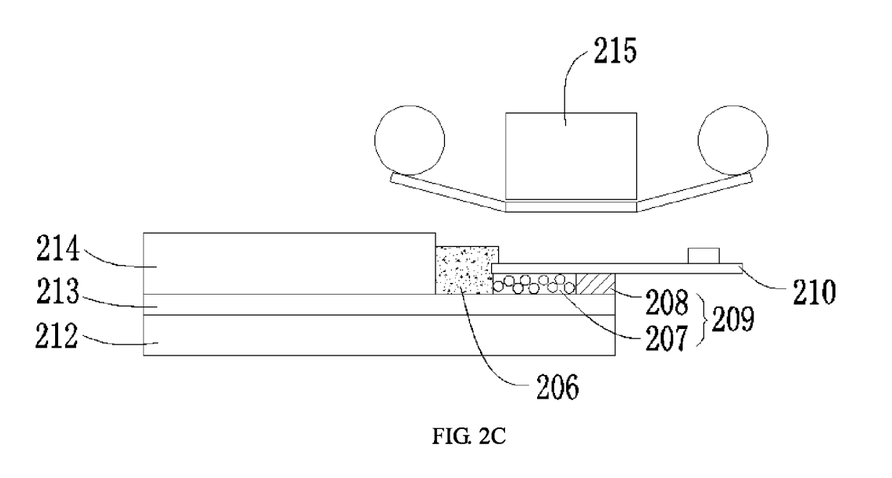
FIG. 2C is a side view of the display panel of the exemplary embodiment according to the present disclosure.

Referring to FIGS. 2A-2C, FIG. 2A is a schematic view of a structure of a display panel of one exemplary embodiment according to the present disclosure. Referring to FIG.

2A, the display panel includes a display area 201 and a non-display area 202 formed at a side of the display area 201. A plurality of signal lines is arranged in the non-display area 202. A bonding area 203 is defined in the non-display area 202. An overlapping area and a non-overlapping area are defined in the non-display area 202 and the bonding area 203. A first area 205 is defined in the non-overlapping area and formed at a side of the bonding area 203. A second area 204 is defined in the non-overlapping area and formed at another, opposite side of the bonding area. The bonding area 203 includes a conductive-particles doped region and an insulating rubber material region located at an end of the conductive-particles doped region away from the display area 201.

The bonding area 203 can extend away from the display area 201 to an correspondingly edge of the display panel. However, in order to avoid the rubber material formed in the insulating rubber material area from overflowing to a side surface of the display panel to adversely affect a peeling process of the glass substrate, preferably, a space distance is defined between the bonding area 203 and the edge of the display panel.

Referring to FIG. 2B, FIG. 2B is a top view of the display panel of the exemplary embodiment according to the present disclosure. A plurality of the thin film transistors and a plurality of pixel units are formed in the display area 201. Ends of one side of the signal lines 211 arranged in the non-display area are correspondingly connected to the thin film transistors. Ends of another, opposite side of the signal lines 211 arranged in the non-display area extend to the bonding area. A conductive adhesive layer 209 is formed in the bonding area. The conductive adhesive layer 209 includes a conductive-particles doped region 207 and a first insulating rubber material region 208 formed at one side of the conductive-particles doped region 207. The first insulating rubber material region 208 is formed between the conductive-particles doped region 207 and the second area to cover the signal lines 211 exposed from one side of the conductive-particles doped region 207 away from the display area 201. The flexible circuit board 210 is bonded to an edge of the display panel by the conductive adhesive layer 209. A plurality of connection terminals is formed on the flexible circuit board 210. The connection terminals are placed in the bonding area. The connection terminals are electrically connected to the signal lines 211 by the conductive-particles doped region 207. After the flexible circuit board 210 is bonded with the display panel, a waterproof adhesive layer 206 is formed in the first area. The waterproof adhesive layer 206 and the conductive adhesive layer 209 totally cover the signal lines 211 and the connection terminals formed on the flexible circuit board 210 to form a hermetical structure around the signal lines 211 and the connection terminals, to avoid moisture from entering into its interior, to solve a problem of OLED products that after a COF bonding process there is no waterproof adhesive layer in the backside thereof, and to improve product quality and reliability.

Referring to FIG. 2C, FIG. 2C is a side view of the display panel of the exemplary embodiment according to the present disclosure. The display panel includes a glass substrate 212, an OLED layer 213 formed on the glass substrate 212, and a polarizer 214 formed on the OLED layer 213. The flexible circuit board 210 is adhered to the conductive adhesive layer 209 and bonded with the display panel by a pressing process with a heat pressing device 215. During the pressing process, the first insulating rubber material region 208 formed at one side of the conductive-particles doped region 207 extends toward the second area (an edge of the display panel to totally cover the signal lines of the conductive-particles doped region 207 near the edge of the display panel and a correspondingly part of the connection terminals. After the bonding process is finished, the waterproof adhesive layer 206 is formed in the first area defined between the conductive adhesive layer 209 and the polarizer 214.

In one embodiment, a width of the conductive-particles doped region 207 is larger than a width of the first insulating rubber material region 208. In one embodiment, the waterproof adhesive layer 206 at least extends to one side surface of the flexible circuit board 210.

Figure 3:
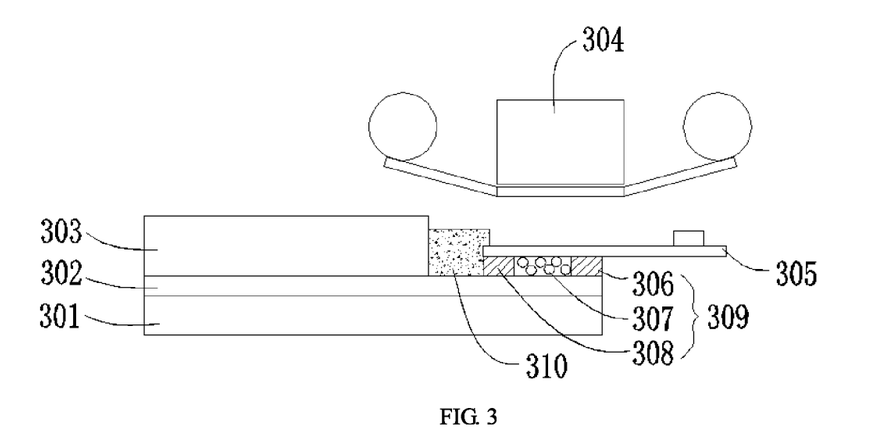
FIG. 3 is a schematic view of a display panel of another exemplary embodiment according to the present disclosure.

Referring to FIG. 3, FIG. 3 is a schematic view of a structure of a display panel of another exemplary embodiment according to the present disclosure. The embodiment is a preferable embodiment of the invention. The display panel includes a glass substrate 301, an OLED layer 302 formed on the glass substrate 301, and a polarizer. The display panel further includes a flexible circuit board 305 which is bonded to the display panel through a conductive adhesive layer 309. Compared with FIG. 2, a distinguishing technique is: a second insulating rubber material region 308 is formed at another, opposite side of the conductive-particles doped region 307 of the conductive adhesive layer 309. The first insulating rubber material region 306 extends toward the second area and ends at an edge of the bonding area. The second insulating rubber material region 308 extends toward the first area and ends at another edge of the bonding area. After an end surface of the flexible circuit board 305 with the connection terminals is adhered to the conductive adhesive layer 309, a pressing process is applied by a heat pressing device 304. By the support of the rubber material of the first insulating rubber material region 306 and the second insulating rubber material region 308, a same flowability of the conductive-particles doped region 307 regarding left and right sides thereof, an accuracy for the pressing operation can be promoted. The rubber material of the conductive-particles doped region 307 can be different from the rubber material of the first insulating rubber material region 306 and the second insulating rubber material region 308, and the two rubber materials has a low degree permeation to avoid the rubber material of the conductive-particles doped region 307 from permeating into the rubber material of the first insulating rubber material region 306 and the second insulating rubber material region 308 during the pressing process and to avoid an inferior pressing accuracy. In one embodiment, a width of the first insulating rubber material region 306 is same as a width of the second insulating rubber material region 308. The conductive adhesive layer 309 and the waterproof adhesive layer 310 cover the signal lines of the non-display area and the connection terminals to achieve an anti-corrosion effect. Because a back surface does not need a waterproof adhesive layer thereon, the glass substrate 301 can be easily peeled from the OLED layer 302 in a subsequent process.

Figure 4:
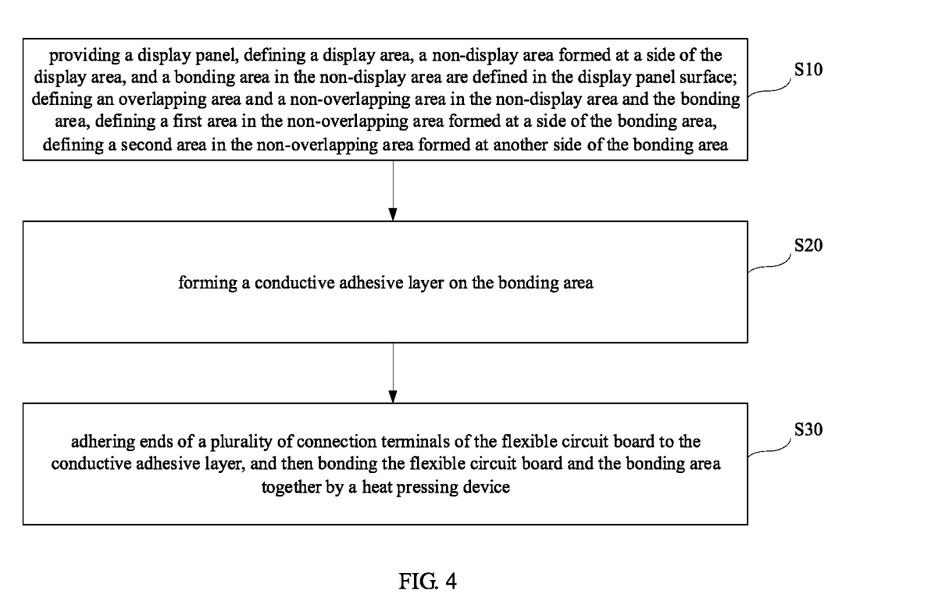
FIG. 4 is a flow chart of a bonding method of a display panel of one exemplary embodiment according to the present disclosure.

The present disclosure further provides a bonding method of the display panel. Referring to FIG. 4, the method includes:

S10: a display panel is provided; a surface of the display panel is defined with a display area, a non-display area formed at a side of the display area and a bonding area defined in the non-display area; an overlapping area and a non-overlapping area are defined in the non-display area and the bonding area; a first area is defined in the non-overlapping area and formed at a side of the bonding area; and a second area is defined in the non-overlapping area and formed at another, opposite side of the bonding area.

A plurality of signal lines is arranged in the non-display area. A bonding area is defined in the non-display area. A plurality of thin film transistors is formed in the bonding area. Ends of a side of the signal lines extend to the bonding area, and ends of another, opposite side of the signal lines are correspondingly connected to the thin film transistors.

S20: a conductive adhesive layer is formed on the bonding area.

The conductive adhesive layer includes a conductive-particles doped region and a first insulating rubber material region formed at one side of the conductive-particle doped region. The first insulating rubber material region is formed between the conductive-particle doped region and the second area S30: ends of a plurality of connection terminals of the flexible circuit board are adhered to the conductive adhesive layer, and then the flexible circuit board and the bonding area are bonded together by a heat pressing device.

The connection terminals disposed at an adhering surface of the flexible circuit board adhered to the conductive adhesive layer are arranged in the bonding area.

S40: a waterproof rubber layer is formed in the first region to form a sealant layer in the non-display region, which consists of the waterproof rubber layer and the conductive adhesive layer.

The waterproof adhesive layer at least extends to a side surface of the flexible circuit board to ensure that moisture will not enter into the connection terminals of the flexible circuit board In one embodiment, the conductive adhesive layer further includes a second insulating rubber material region formed at another, opposite side of the conductive-particles doped region. The second insulating rubber material region extends toward the first area and ends at one side edge of the bonding area. The first insulating rubber material region extends toward to the second area and ends at an edge of another, opposite side of the bonding area.

The rubber material of the conductive-particles doped region and the rubber material of the first insulating rubber material region and the second insulating rubber material region can be the same or different.

In the display panel and the bonding method of the display panel of the present disclosure, among a COF bonding process, an insulating rubber material layer is formed at one side or two sides of the conductive-particles doped region of the conductive adhesive layer to increase a width of the conductive adhesive layer. A front waterproof adhesive layer covers signal lines of a display area to form a sealed waterproofing area. Without increasing the equipment and cost for manufacturing the display panel, the present disclosure solve a corrosion risk of a back surface of OLED products, which cannot be applied with a waterproof adhesive layer after a COF bonding process. The present disclosure makes the back surface of OLED products not necessary to be coated with the waterproof adhesive layer, whereby to separate a glass substrate from the flexible OLED products can be conveniently proceeded with without adversely affecting the sequent processing; because the insulating rubber material layers formed at two sides of the conductive-particles doped region have a supporting function to make a same flowability in left and right sides of the conductive-particles doped region during a pressing process to promote a pressing accuracy. The problem of accurate pressing which may occur by a decreased size of the bonding area can be prevented by the present disclosure. The present disclosure can ensure that the conductive properties of the conductive-particles doped region are not affected, and also ensure that the signal lines of the non-display area are not in contact with the air to avoid the lines from corrosion, and to save the coating process, thereby to improve product quality and reliability and to improve a corrosion resistance of the product's use in an environment.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel comprises a display area and a non-display area formed at a side of the display area, a plurality of signal lines is arranged in the non-display area, a bonding area is defined in the non-display area, ends of one side of the signal lines extend to the bonding area;
    an overlapping area and a non-overlapping area are defined in the non-display area and the bonding area, a first area is defined in the non-overlapping area and formed at a side of the bonding area, a second area is defined in the non-overlapping area and formed at another, opposite side of the bonding area; and
    a waterproof adhesive layer is formed in the first region, a conductive adhesive layer is formed in the bonding area; wherein the conductive adhesive layer comprises a conductive-particles doped region and a first insulating rubber material region formed at one side of the conductive-particles doped region, and the first insulating rubber material region is formed between the conductive-particles doped region and the second area.

2. The display panel of the claim 1, wherein a second insulating rubber material region is formed at another, opposite side of the conductive-particles doped region, the second insulating rubber material region extends toward the first area and ends at a side edge of the bonding area, the first insulating rubber region extends toward the second area and ends at another, opposite side edge of the bonding area.

3. The display panel of the claim 2, wherein the waterproof adhesive layer and the conductive adhesive layer are formed on the signal lines.

4. The display panel of the claim 1, wherein a flexible circuit board is connected with the display panel, a plurality of connection terminals is formed on the flexible circuit board, the connection terminals are correspondingly located in the bonding area.

5. The display panel of the claim 4, wherein the waterproof rubber layer extends at least to one side surface of the flexible circuit board.

6. A bonding method of a display panel, wherein the method comprises:
    a step S10 of providing a display panel, defining a display area, a non-display area formed at a side of the display area, and a bonding area in the non-display area are defined in the display panel surface; defining an overlapping area and a non-overlapping area in the non-display area and the bonding area, defining a first area in the non-overlapping area formed at a side of the bonding area, defining a second area in the non-overlapping area formed at another, opposite side of the bonding area;
    a step S20 of forming a conductive adhesive layer on the bonding area;

a step S30 of adhering ends of a plurality of connection terminals of the flexible circuit board to the conductive adhesive layer, and then bonding the flexible circuit board and the bonding area together by a heat pressing device; and wherein the conductive adhesive layer comprises a conductive-particles doped region and a first insulating rubber material region formed at one side of the conductive-particles doped region, the first insulating rubber material region is formed between the conductive-particles doped region and the second area.

7. The bonding method of claim 6, wherein the conductive adhesive layer further comprises a second insulating rubber material region is formed at another, opposite side of the conductive-particles doped region, and the second insulating rubber material region extends toward the first area and ends at one side edge of the bonding area.

8. The bonding method of claim 6, wherein the connection terminals formed on the flexible circuit board are correspondingly located in the bonding area.

9. The bonding method of claim 6, wherein the step S30 further comprising:

a step S40 of forming a waterproof rubber layer in the first region to forming a sealant layer combined by the waterproof rubber layer and the conductive adhesive layer in the non-display region.

10. A display panel, wherein the display panel comprises a display area and a non-display area formed at a side of the display area, at least two signal lines are arranged in the non-display area, a bonding area is defined in the non-display area, ends of one side of the signal lines extend to the bonding area;

a plurality of thin film transistors are formed in the display area, ends of another, opposite side of the signal lines are correspondingly connected to the thin film transistors;

an overlapping area and a non-overlapping area are defined in the non-display area and the bonding area, a first area is defined in the non-overlapping area formed at a side of the bonding area, a second area is defined in the non-overlapping area formed at another, opposite side of the bonding area; and a waterproof adhesive layer is formed in the first region, a conductive adhesive layer is formed in the bonding area; wherein the conductive adhesive layer comprises a conductive-particles doped region and a first insulating rubber material region formed at one side of the conductive-particles doped region, the first insulating rubber material region is formed between the conductive-particles doped region and the second area.

11. The display panel of the claim 10, wherein a second insulating rubber material region is formed at another, opposite side of the conductive-particles doped region, the second insulating rubber material region extends toward the first area and ends at a side edge of the bonding area, the first insulating rubber region extends toward the second area and ends at another, opposite side edge of the bonding area.

12. The display panel of the claim 10, wherein the waterproof adhesive layer and the conductive adhesive layer are formed on the signal lines.

13. The display panel of the claim 10, wherein a flexible circuit board is connected with the display panel, a plurality of connection terminals is formed on the flexible circuit board, the connection terminals are correspondingly located in the bonding area.

14. The display panel of the claim 13, wherein the waterproof rubber layer extends at least to one side surface of the flexible circuit board.

* * * * *